(12) United States Patent
Valenzuela et al.

(10) Patent No.: US 7,821,363 B2
(45) Date of Patent: Oct. 26, 2010

(54) METHOD AND APPARATUS FOR BENDING ELECTROSTATIC SWITCH

(75) Inventors: Sergio Osvaldo Valenzuela, Cambridge, MA (US); Douwe Johannes Monsma, Cambridge, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 126 days.

(21) Appl. No.: 12/032,109

(22) Filed: Feb. 15, 2008

(65) Prior Publication Data
US 2008/0185271 A1 Aug. 7, 2008

Related U.S. Application Data

(63) Continuation of application No. 11/195,064, filed on Aug. 2, 2005, now Pat. No. 7,355,258.

(51) Int. Cl.
*H01H 51/22* (2006.01)
(52) U.S. Cl. .................................. 335/78; 200/181
(58) Field of Classification Search ................ 335/78; 200/181
See application file for complete search history.

(56) References Cited

U.S. PATENT DOCUMENTS

| | | | |
|---|---|---|---|
| 6,020,564 A | 2/2000 | Wang et al. | |
| 6,487,151 B1 | 11/2002 | Nagata et al. | |
| 6,534,839 B1 | 3/2003 | Frazier et al. | |
| 6,621,390 B2 * | 9/2003 | Song et al. | 335/78 |
| 6,847,152 B2 | 1/2005 | Miller et al. | |
| 6,977,569 B2 * | 12/2005 | Deligianni et al. | 335/78 |
| 7,215,229 B2 * | 5/2007 | Shen et al. | 335/78 |
| 7,528,691 B2 * | 5/2009 | Wallis et al. | 335/78 |
| 2007/0256917 A1 * | 11/2007 | Oberhammer et al. | 200/181 |

OTHER PUBLICATIONS

Jack W. Judy, "Microelectromechanical systems (MEMS): fabrication, design and applications," Smart Matter. Struct. 10 (2001) 1115-1134.
W. Tang, T. Nguyen and R. Howe, "Laterally Driven, Polysilicon Resonant Microstructures, "Sensors & Actuators A, 25-32 (1989).
E.H. Francis, R. Kumaran, B.L. Chua and V.L. Logeeswaran, "Electrostatic Spring effect on the Dynamic Performance of Microresonators".

* cited by examiner

*Primary Examiner*—Elvin G Enad
*Assistant Examiner*—Bernard Rojas
(74) *Attorney, Agent, or Firm*—24IP Law Group; Timothy R. DeWitt

(57) ABSTRACT

An electronic circuit is formed by closely spacing metallic gate and drain interconnects to a flexible portion of a source interconnect. A gate voltage results in electrostatic attraction and lateral mechanical movement of the flexible source interconnect portion and causes an electrical short between source and drain. VanderWaals attraction between contacting source and drain can be used to provide volatile switching (springy thicker source portion) and non-volatile switching (limp thinner source portion). In accordance with the invention, an easily fabricated, high speed, low power, radiation hard, temperature independent, integrated reconfigurable electronic circuit with embedded logic and non-volatile memory can be realized. The switch uses patterned interconnect material for its structure and can be incorporated to a 3D layered structure consisting of three dimensional interconnect in which different layers and portions of the circuits are linked through volatile and non-volatile switches.

17 Claims, 14 Drawing Sheets

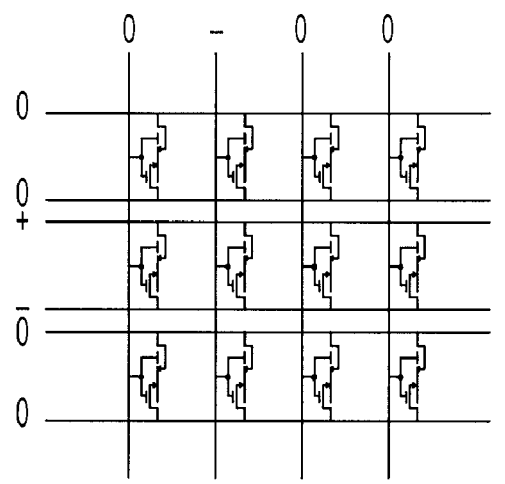
FIG. 12A   WRITE 1
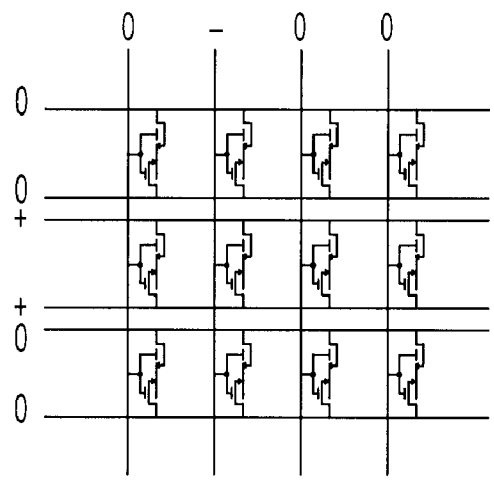
FIG. 12B   WRITE 0
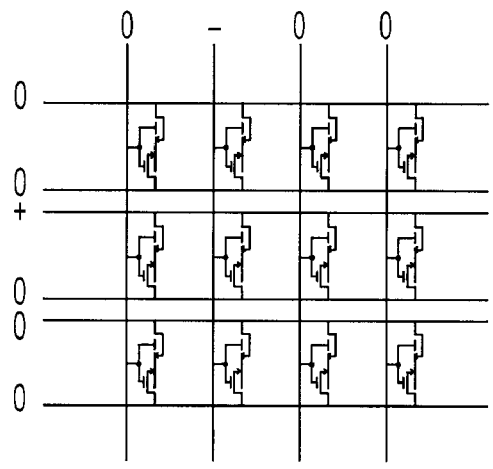
FIG. 12C   READ

METHOD AND APPARATUS FOR BENDING ELECTROSTATIC SWITCH

CROSS-REFERENCE TO RELATED APPLICATIONS

The present application is a continuation of and claims the benefit of the filing of U.S. Non-provisional patent application Ser. No. 11/195,064, which was filed by the present inventors on Aug. 2, 2005 now U.S. Pat. No. 7,355,258.

STATEMENT REGARDING FEDERALLY SPONSORED RESEARCH OR DEVELOPMENT

Not Applicable.

BACKGROUND OF THE INVENTION

1. Field of the Invention

The present invention relates to electrostatic switches, and more particularly, to laterally-bending electrostatic switches.

2. Description of the Related Art

The invention of the bipolar transistor in 1945 came in a time of analog electronics. At that time, dynamic signal amplification was a necessity. The advent of digital logics has eliminated this requirement, yet transistors are still used as switches in integrated circuits despite their complicated doped structures, single crystal material requirements, intricate contacting to metal interconnects, sensitivity to radiation and limited active temperature range (below 150 C.).

In spite of this, performance in the semiconductor industry has increased exponentially in the last 40 years. This was accomplished by scaling down a transistor's size, increasing die size and enhancing the interconnect efficiency. The scaling of transistors reduces the intrinsic switching delay and dissipation. Scaling of interconnects however results in larger interconnect lengths which leads to an increase in the latency or response time and energy dissipation as compared to that in transistors. For submicron technology "RC" delays from interconnects becomes a dominant factor. It was expected that a change to copper interconnects (lower R) and low-k dielectrics (lower C) would allow the exponential increase in performance to continue through this decade.

While copper interconnects have been successfully integrated to the fabrication process the same cannot be said for low-k dielectrics, which seems to indicate the end for device scaling, as we know it. The current situation urges the search for alternatives for current 2-D silicon technology.

A possible solution is 3-D integration. Replacing the long interconnects in 2-D structures by short vertical ones would enhance performance. This would also allow the integration of different technologies and reduce the size of the final package.

Three main 3-D integration techniques have been proposed: multichip stacks, recrystallized silicon, and monolithic wafer level integration. An extraordinary challenge for the 3-D integration is how to go effectively from silicon to interconnect to silicon again.

As the name indicates, multichip stacks consist of interconnecting fully processed chips together by lining up bond pads on each chip and solder them. One of the problems of this approach is the lack of precision alignment, which restricts the number and size of interconnects. The silicon between layers also creates thermal resistance and reduces heat dissipation. Meanwhile, the more layers the chip has the more space is lost to vias for interconnects, reducing the available space for active elements such as transistors.

In the recrystallized silicon approach, a layer of polycrystalline silicon is grown on top of the substrate and then partially recrystallized by heating it. This creates new silicon layers in which to create transistors and other elements. This has the advantage of a thinner silicon layer than in the multichip stack approach. However, high temperatures for recrystallization would damage circuits in the bottom layers. Also the carrier mobility on the polysilicon is lower compared to the one in single-crystal silicon, which slows performance.

In the monolithic wafer-level integration entire wafers are glued and then cut into single chips. This would reduce costs as compared to the multichip stack process because an entire wafer with many chips is handled at once. Fabricators will have similar problems on wafer alignment, bonding, silicon thinning (to reduce thermal resistance) and interconnect connection. The complexity and costs that wafer-scale integration implies could render the whole task impossible.

In addition, no high speed (<10 ns) non-volatile semiconductor memory elements have ever been realized. Some memory elements based on magnetic tunnel junctions, phase change materials, programmable metallization cells, nanotube arrays and ionic polymers have been designed, however, all require integration with metal-semiconductor circuits and none have demonstrated cost effective high-speed high-density operation.

Micromechanical electrostatic switches have been proposed for switching of RF signals. Some examples of such micromechanical electrostatic switches are shown and discussed in "Microelectromechanical systems (MEMS): fabrication, design and applications," by J. Judy, Smart, Mater. Struct. 10 (2001) 1115-1134. The switching itself in a micromechanical electrostatic switch is usually on the order of microseconds.

An example is show in FIG. 1. The operation principle is simple: with a positive voltage on the source, a negative voltage on the gate will attract the beam and will form an electrical short between source and drain. The force between the gate and source can be approximated by the equation for a force between parallel capacitor plates:

$$F = \varepsilon_0 A \frac{V^2}{d^2}$$

where $\varepsilon_0$ is the permittivity of vacuum, A is the gate area, V is the gate-source voltage and d is the distance between the gate electrode and source beam. The force of the electric field is counteracted by the spring force of the beam resulting in a threshold voltage for switching according to:

$$V_{th} = \frac{2}{3} d \sqrt{\frac{2kd}{3\varepsilon_0 A}}$$

Here $V_{th}$ is the switching threshold voltage, d the thickness of the beam, k the effective spring constant of the beam and A the area of the gate. This spring constant k can be approximated by:

$$k = bt^3 \frac{Y^2}{4L^3}$$

where b is the width, t the thickness and L the length of the beam.

In FIG. 1, the cantilever structures were approximately 65 microns in length, and 30 microns wide. The thickness of the cantilevers is approximately 2 microns and the beam-to-gate spacing is about 1.5 microns. The threshold voltage is about 50 volts and the device will operate at between 2 and 3 MHz. More than 1 million switch cycles have been demonstrated. Above this the gold contacts started to deteriorate due to fusing of gold atoms. For wear free switching inert contact coatings are needed.

The gate area, and thus force, is much larger than the drain area. This in principle reduces the attraction by the drain electrode and allows amplification. However, this requires large devices. An alternative is to electrically isolate the contacting area from the gate area, forming a relay instead of a switch (see U.S. Pat. No. 6,152,839 to Zavracky relating to micromechanical switching devices). This however is very complicated to fabricate. Although the principle of switching is useful for digital logics, this design is not sufficiently fast, operates at very high voltages and is too large and complicated to produce for integrated circuit applications.

A sufficiently fast low voltage design based on a carbon nanotube (CNT) beam has been proposed very recently and is depicted in FIG. 2. This is a schematic picture of the theoretical model system consisting of a conducting carbon nanotube (CNT) placed on a terraced Si substrate. The terrace height is labeled h, and q denotes the excess charge on the tube. The CNT is connected to a source electrode (S), and the gate (G) and drain (D) electrodes are placed on the substrate beneath the CNT at lengths L and $L_G$ away from the terrace. The displacement x of the nanotube tip is measured towards the substrate. Typically, L is about 50-100 nm, h=5 nm.

This prior art theoretical proposal has several advantages over the switch in FIG. 1, namely small dimensions, fast switching (1 ns), low voltage operation (1 V) and potential absence of sticking due to the inert nature of the nanotube. Non-volatility is provided by the adhesion properties of the beam to the drain: sticking based on VanderWaals forces can lead to sufficient hysteresis. However, because the drain attracts the CNT just like the gate does, the source-drain voltage must always be lower than the source-gate voltage, which means that amplification is not possible in the design of FIG. 2. In other words, the drain output of the CNT switch cannot control the gate of another CNT switch, precluding logic operation. In addition, the realization and fabrication of this CNT switch is complicated. Growth of nanotubes is still unpredictable, both in number, orientation, dimension, location, and conductance type (metallic or semiconducting). Forming a high yield integrated circuit with millions of these switches with all the same properties and subnanometer accurate CNT beam positioning seems unrealistic within this geometry. In addition, forming low resistance metal interconnect-CNT contacts and low resistance beam-drain contact is challenging: a clear disadvantage of switches that are based on material foreign to metallic interconnects.

Similarly, electrostatic switches have been proposed with either a vertically moving cantilever (FIG. 3(a)) or laterally moving cantilever (FIG. 3(b)). Here counter drain electrodes with a permanent voltage have been suggested to provide an attractive force to the cantilever, to realize opening of the switch besides using stress in the cantilever. Thus, applying a source-gate voltage performs closing, and the constant source-control voltage realizes opening. The disadvantage of this structure is that a separate voltage line is needed and that the source-control voltage depends on the source voltage. This source voltage can vary throughout a logic circuit. Moreover, a very large gate area is needed to provide a difference between source-gate attraction and source-drain attraction, precluding nanoscale scaling of the switches. Furthermore, no contact materials have been specified that can support operating without wear at the contact site.

What is needed is an easily manufacturable nanometer size-amplifying switch that can operate fast (<1 ns), in a wide temperature range (up to 1000 C.), using low power and low voltage and is radiation hard and wear-free. In addition, non-volatility is needed to provide reconfigurable logics and embedded memory. As interconnects are an essential part of proposed technologies, an scheme that incorporates interconnects and switching devices in similar fabrication steps would represent important advantages regarding simplicity of fabrication—and as a consequence cost—, RC delay times, interconnection and 3-D expansion.

Considering the fact that high conductance metals such as copper are still the ideal choice for low RC constant interconnects, a non-volatile switch made from this same metal in a straightforward geometry facilitates fabrication. It is an objective of this invention to provide a volatile and non-volatile switch that uses patterned interconnect metal for its structure and electrostatics to provide mechanical movement for switching. Another objective is to form an electronic circuit with reconfigurable logic and non-volatile memory from these elements. It is a further objective to form a 3D layered structure consisting of three-dimensional interconnects in which different layers are linked through volatile or non-volatile switches.

SUMMARY OF THE INVENTION

An electronic circuit is formed by closely spacing metallic gate and drain interconnects to a flexible portion of a source interconnect. A gate voltage results in electrostatic attraction and lateral mechanical movement of the flexible source interconnect portion and causes an electrical short between source and drain. Surrounding the drain electrode around the source cantilever allows for source-drain force compensation, such that the net source-drain attraction is small. Thus, the gate-source attraction will be larger, providing amplification of the element. Surrounding the source cantilever with the drain electrode is exemplified with two configurations: a horizontally extending, laterally moving cantilever and a vertically extending laterally moving cantilever. Van der Waals attraction between contacting source and drain can be used to provide volatile switching (springy thicker source portion, or smaller contact area) and non-volatile switching (limp thinner source portion or larger contact area). In accordance with the invention, an easily fabricated, high speed, low power, radiation hard, temperature independent, integrated reconfigurable electronic circuit with logic and embedded non-volatile memory can be realized. Horizontal extending switches are easier to fabricate than vertical ones, which could be an advantage for applications where cost, and not scalability is the important factor. Vertical switches on the other hand occupy a smaller space and the gap between the source and drain and gates can be made smaller and then have advantages in scalability and packaging. As the fabrication of interconnects can be expanded to include several layers as in current semiconductor technology and due to the fact that the active devices are embedded in the process, 3-D stacking is straightforward.

The present invention disclosed and claimed herein is an electrostatic switch comprising a substrate, an electrically conducting gate electrode mounted on the substrate, and electrically conducting source electrode mounted on the substrate, the source electrode having a laterally bendable cantilever portion, and an electrically conducting drain electrode partially surrounding the source cantilever portion to reduce the net electrostatic force exerted by the drain on the source. In a preferred embodiment, the source cantilever portion has an undeflected state when no source-gate bias is applied and a deflected state when a finite source-gate bias is applied. The source cantilever portion contacts the drain electrode when in its deflected state. The source electrode may be formed from a material containing copper, carbon, tungsten or a combination of them.

In another embodiment, the present invention is an integrated logic circuit comprising a substrate, a multilayer stack comprising patterned conducting interconnect layers separated by insulating layers, at least one flexible cantilever plug positioned between the conducting interconnect layers wherein the plug is substantially perpendicular to the substrate and wherein the axis of motion of the plug is substantially parallel to the substrate. The flexible plugs form an open electrical circuit between two conducting layers in an undeflected state, and a short in a deflected state. The deflected state results from a voltage between a portion of a third interconnect layer and a portion of one of the first two interconnect layers. The logic circuit may further comprise fixed conducting plugs substantially perpendicular to the substrate, connecting at least two of the patterned conducting layers. The source electrode may be formed from a material containing copper, carbon, tungsten or a combination of them.

In still another embodiment, the invention is incorporated in a memory cell comprising a substrate, a first electrically conducting electrode mounted on the substrate comprising a flexible cantilever portion substantially perpendicular to the substrate, an axis of motion of the flexible cantilever portion being substantially parallel to the substrate, a second electrically conducting electrode mounted on the substrate comprising a flexible cantilever portion substantially perpendicular to the substrate and axis of motion of said flexible cantilever portion substantially parallel to the substrate, an electrically conducting gate electrode mounted on the substrate in close separation from the first and second cantilevers such as to enable parallel movement of both cantilevers, and an electrically conducting electrode mounted on the substrate closely separated from said first and second cantilevers such as to enable opening and closing of cantilever-drain contacts under application of a cantilever-gate voltage.

Still other aspects, features, and advantages of the present invention are readily apparent from the following detailed description, simply by illustrating preferable embodiments and implementations. The present invention is also capable of other and different embodiments, and its several details can be modified in various respects, all without departing from the spirit and scope of the present invention. Accordingly, the drawings and descriptions are to be regarded as illustrative in nature, and not as restrictive.

BRIEF DESCRIPTION OF THE DRAWINGS

The accompanying drawings, which are incorporated in and constitute a part of this specification illustrate some embodiments of the invention and, together with the description, serve to explain some aspects, advantages, and principles of the invention. In the drawings.

FIG. 12 is a schematic diagram of an array consisting of memory cells of FIG. 11.

In FIG. 14A the fixed end of the switch is closest to the substrate, whereas in FIG. 14B the free end of the switch is closest to the substrate.

DETAILED DESCRIPTION OF THE INVENTION

Figure 4:
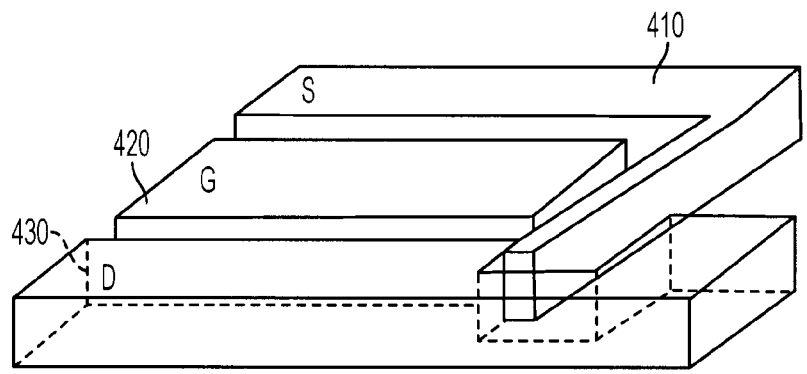
FIG. 4 is a plan view of an electrostatic switch in accordance with an embodiment of the present invention and formed from patterned interconnect metal.
Figure 5:
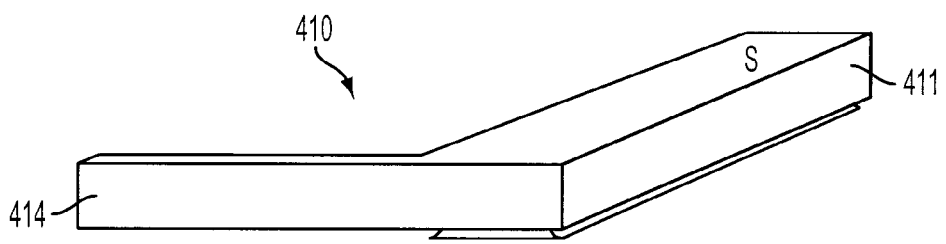
FIG. 5 is a diagram of source electrode of an electrostatic switch having an undercut cantilever in accordance with a preferred embodiment of the present invention.

A preferred embodiment of a switch in accordance with the present invention is shown in FIGS. 4-6. The switch of FIGS. 4-6 is comprised of a source 410, a gate 420 and a drain 430. As shown in FIG. 5, the source 410 has a cantilevered structure with a body portion 411 and a cantilever portion 414. The drain 430 has a body portion 432, a contact portion 434 and an offset portion 436. In a preferred embodiment, the offset portion 436 of the drain 430 is larger that the contact portion 434 of the drain 430.

Figures 6A, 6B:
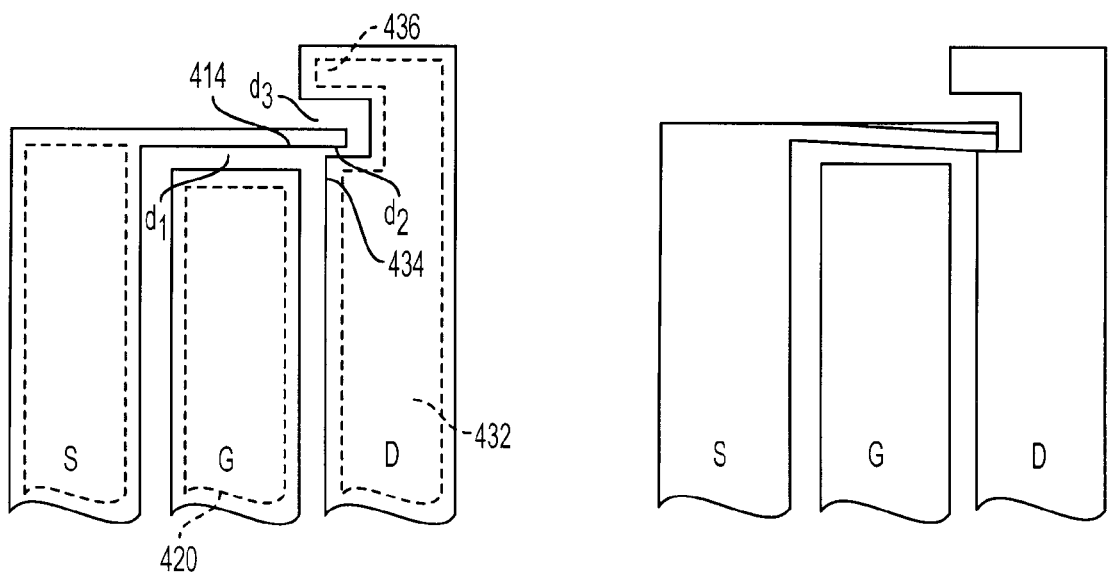
FIGS. 6(*a*) and (*b*) are top views of an electrostatic switch in accordance with a preferred embodiment of the invention in open (a) and closed (b) positions.

In this embodiment, the body portions of the source 410, gate 420 and drain 430 are laid out in a parallel fashion as shown in FIG. 6(*a*) such that the cantilever portion 414 of the source 410 extends across an end of the gate 420 and in between the contact portion 434 of the drain and the offset portion 436 of the drain 430. The cantilever portion 414 of the source 410 is spaced a first distance $d_1$ from the end of the gate 420, a second distance $d_2$ from the contact portion 434 of the drain 430 and a third distance $d_3$ from the offset portion 436 of the drain 430. The first and third distances $d_1$ and $d_3$ each are greater than the second distance $d_2$. In a preferred embodiment, the interconnects and switches are patterned from a 100 nm copper film in one step using standard deep UV lithography and reactive ion etching, but other techniques may be employed. In another embodiment copper is deposited over a polyamide sacrificial layer on a flexible substrate which is etched with UV-Ozone or Oxygen plasma to generate undercut, but other techniques may be employed Application of $+V_S$ to the source 410 and $V_G=0$ to the gate 420 causes the flexible cantilever portion 414 of the source 410 to bend toward the gate 420. However, before the cantilever portion 414 of the source 410 can contact the gate 420, it contacts the contact portion 434 of the drain 430, shorting the source 410 and the drain 430 as shown in FIG. 6(b). Application of $V_D=0$ to the drain 430 causes attraction between source 410 and drain 430 but because the offset portion 436 of the drain 430 folds around the cantilever portion 414 of the source 410, it attracts the cantilever portion 414 of the source 410 from both sides 434, 436, and the net mechanical moment is zero.

Figure 1:
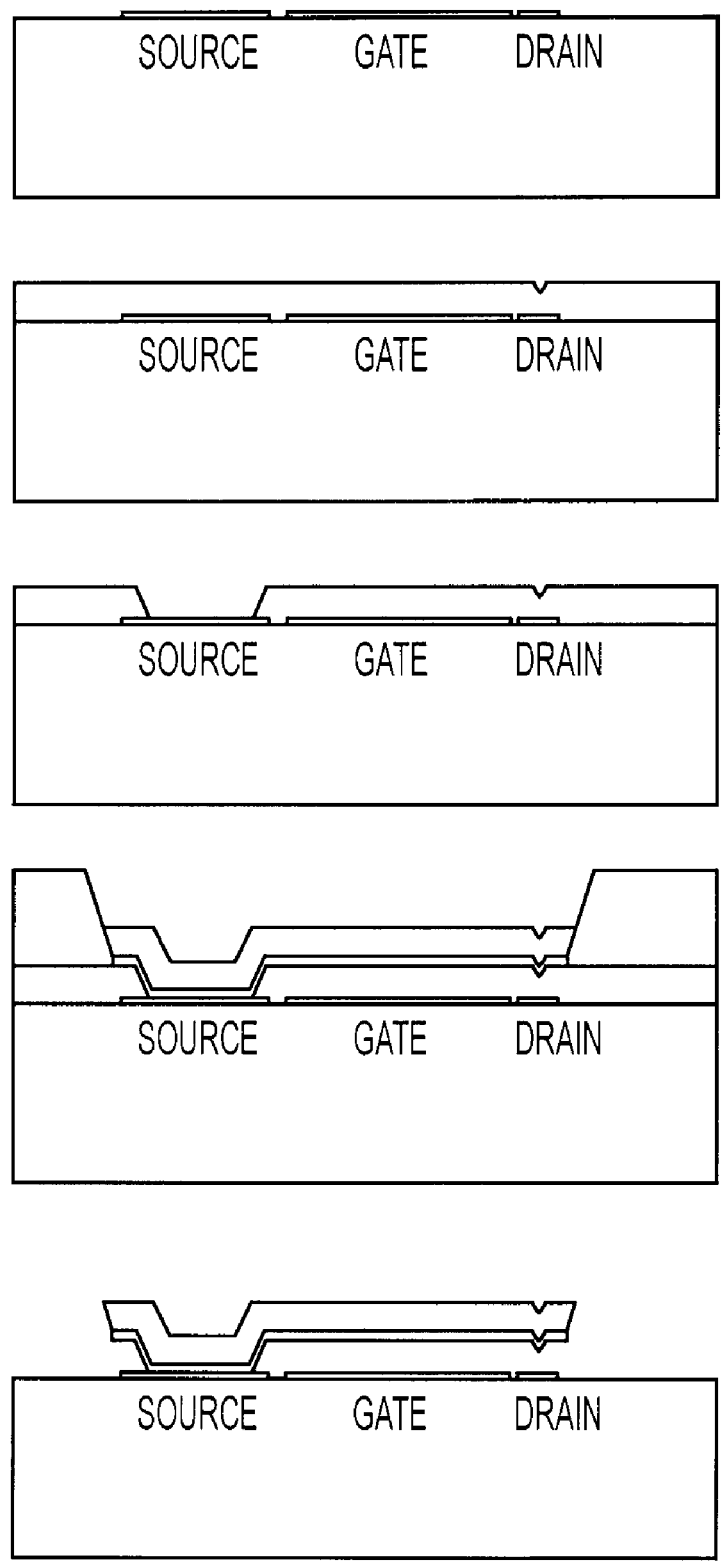
FIG. 1 is a diagram of a fabrication scheme of a prior art electrostatic micro switch.
Figure 2:
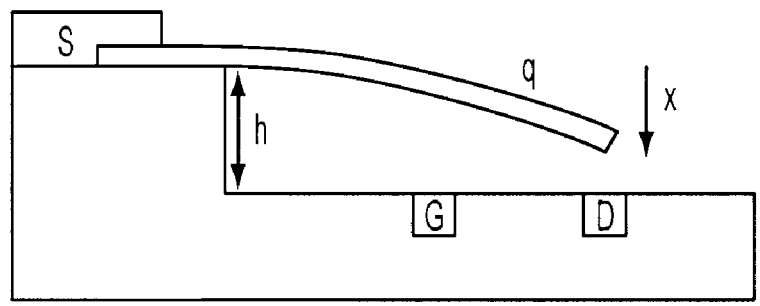
FIG. 2 is a diagram of a cross-section of a theoretical model system consisting of a conducting carbon nanotube (CNT) placed on a terraced Si substrate.
Figure 3A:
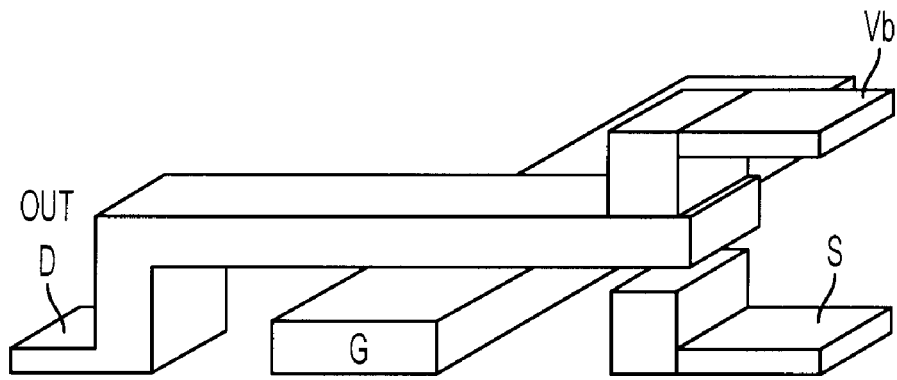
FIGS. 3(*a*) and (*b*) are diagrams of a prior art of electrostatic switches with constant voltage control lines.
Figure 3B:
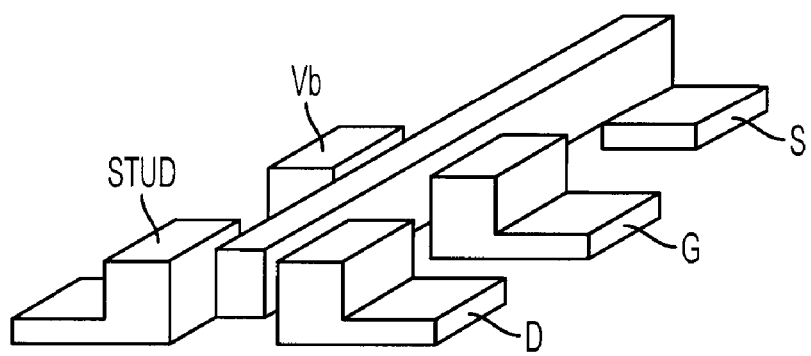

Besides being easy to manufacture, this is a unique feature of the lateral moving design, as opposed to the vertical moving designs in FIGS. 1 and 2, where this compensating drain field cannot be created. Hence, signal amplification independent of source-drain voltage is guaranteed in the design of FIG. 4. The distance between gate 420 and drain 430 is larger than the distance between the source and drain contact, such that upon biasing the gate 420, the source-drain forms a short, but the gate 420 remains electrically disconnected. To null out attraction of the source 410 by the drain voltage, the drain 430 has portions on both sides of the source 410, one with larger area 436, but greater distance (to avoid shorting via this side) and the switching side with very short distance and very small area. In certain applications identical portions 434 and 436 could be preferred. Proper choice of distance and area allow zeroing of the drain force on the source beam. Van der Waals attraction between contacting source and drain can be used to provide volatile switching (springy thicker source portion or smaller contact area) and non-volatile switching (limp thinner source portion, or larger contact area).

The performance of the switch in FIGS. 4-6 is determined by the mechanical properties of the beam and the spacing between interconnects. The mechanical properties of the beam in turn are determined by its aspect ratio and material choice. As a first approximation, the equations used for the switch in FIG. 1 can be used. Using spacings allowed by standard deep 50 nm UV-lithography available in 2005 (roadmap semiconductors, http://public.itrs.net/), one can calculate a threshold voltage of 5V. This however is an estimate and a more accurate voltage can be determined using finite element calculations. Smaller threshold voltages (below 1 V) could be achievable by reducing cantilever flexibility (e.g. by reducing it cross-section appropriately) and/or the distance from the cantilever to the gate.

The switch and layout shown in FIGS. 4-6 is only exemplary, as many other layouts and switches in accordance with the present invention will be apparent to those of skill in the art. Additional examples of switch layouts in accordance with various embodiments of the invention are shown FIGS. 13-14.

Figure 7A:
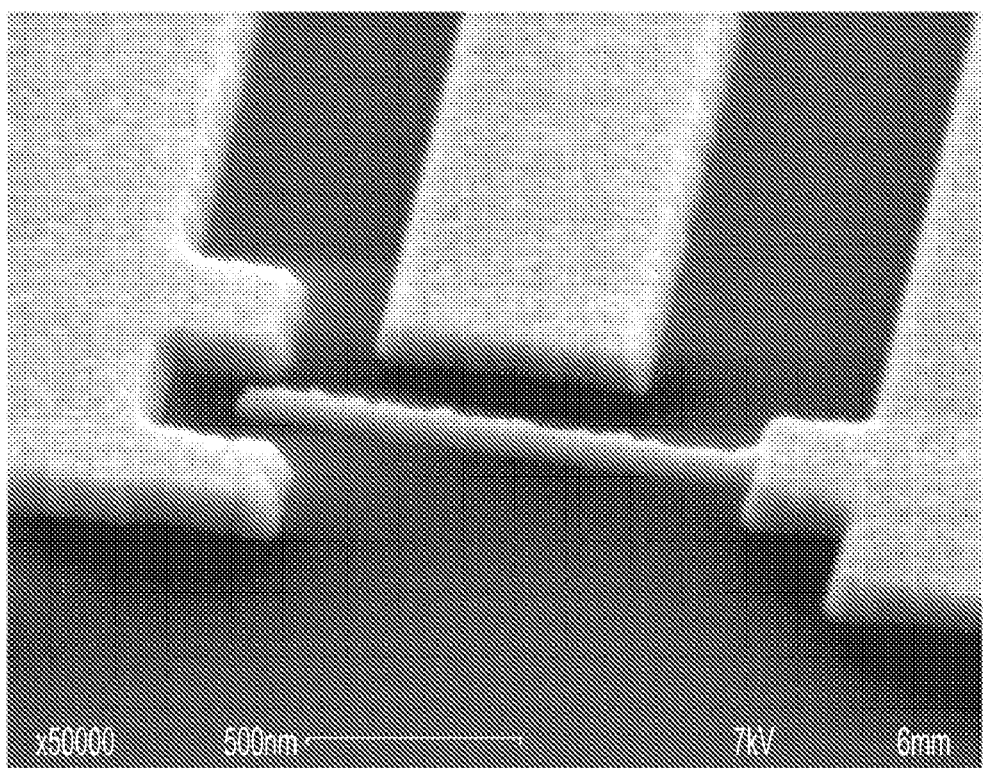
FIGS. 7(*a*) and (*b*) are micrographs of metal switches in accordance with preferred embodiments of the invention.
Figure 7B:
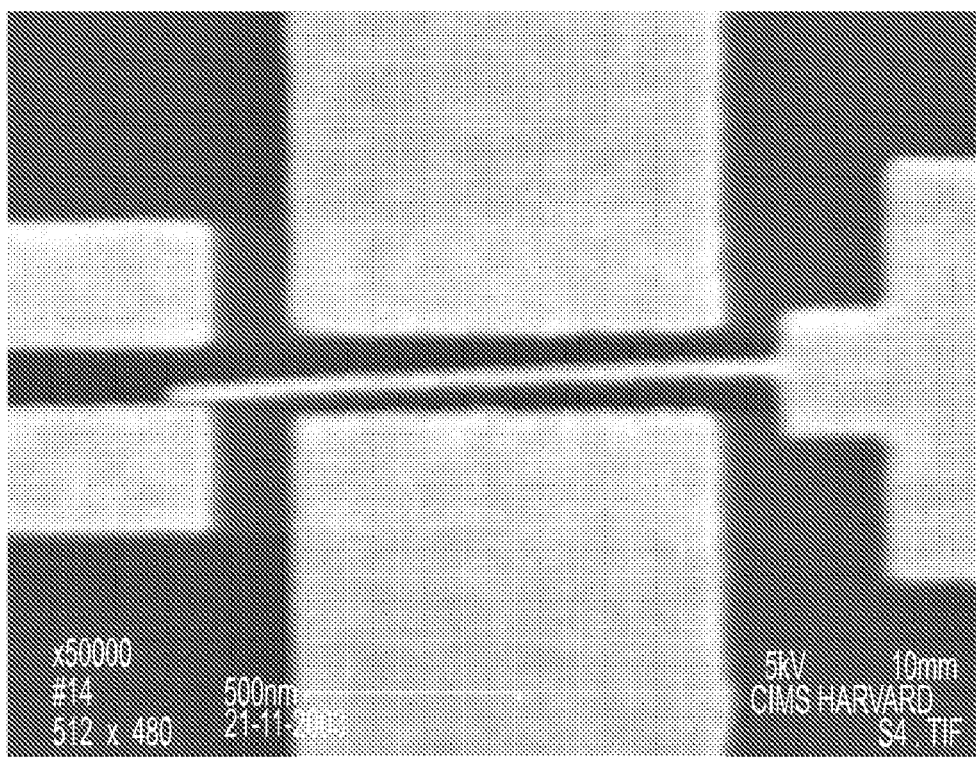

FIGS. 7(a) and (b) are micrographs of exemplary switches. These figures show how a metal switch looks after etching the sacrificial layer. FIG. 7(b) shows a switch with the cantilever making contact to the drain and with two gates.

Figure 8A:
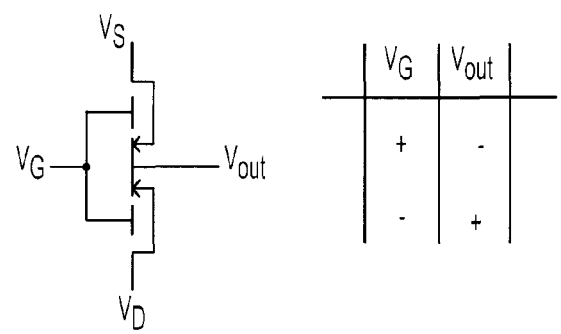
FIGS. 8(*a*), (*b*) and (*c*) are schematic diagrams of an inverter, NOR gate and NAND gate employing micromechanical devices in accordance with a preferred embodiment of the present invention.
Figure 8B:
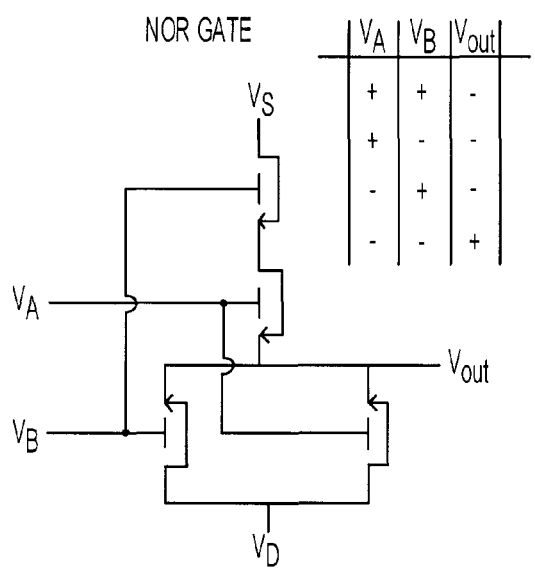
Figure 8C:
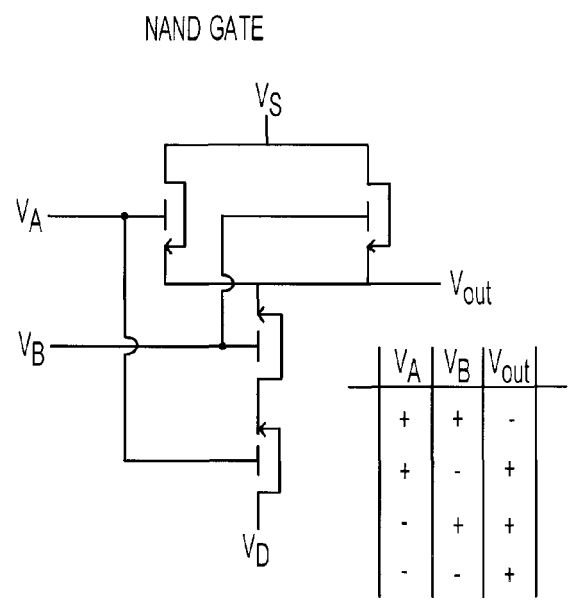
Figure 9:
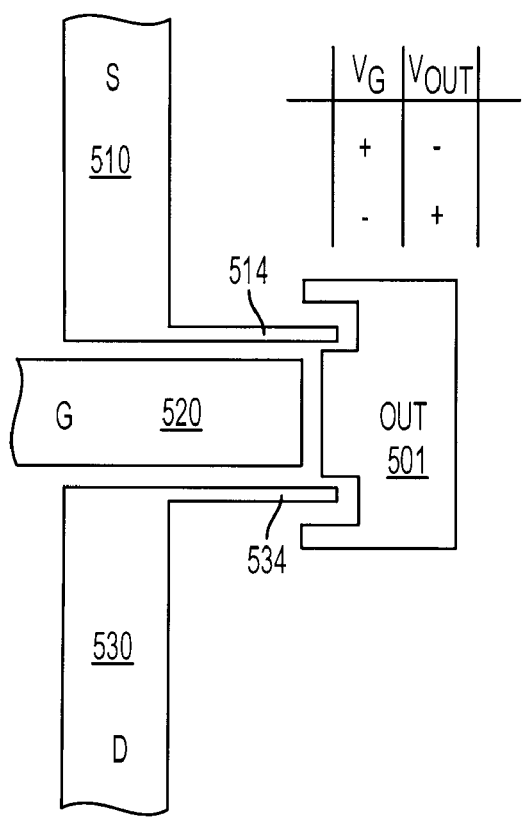
FIG. 9 is a diagram of the inverter of FIG. 8(*a*).

FIGS. 8(a)-(c) show the use of the switch as elements of logic gates. FIG. 9 shows an inverter circuit fabricated with vertically extending laterally moving nanoelectromechanical elements. Here the functionality is similar to that of complementary metal oxide semiconductor (CMOS) logics: no current is flowing from source (S) 510 to drain (D) 530 at any time, reduces dissipation and power. For example, $V_S=+V$, $V_D=-V$ and $V_G=-V$. In this state, the upper switch (514) is closed and the lower switch (534) is open, resulting in a voltage at the output (501) equal to $V_{out}=+V$. When $V_G$ is changed to $V_G=+V$, the upper switch opens and the lower switch closes. The opening may proceed before the closing, because even a 1 nm gap results in high resistance. This means that no current can flow from 514 to 534 at any time, allowing very low power operation. Similarly other logic operations involving multiple inputs can be realized, as shown for a NOR gate (FIG. 8(b)) and a universal NAND gate (FIG. 8(c)). (A NAND gate is called universal, because all other logic gates can be formed from this).

Figure 10:
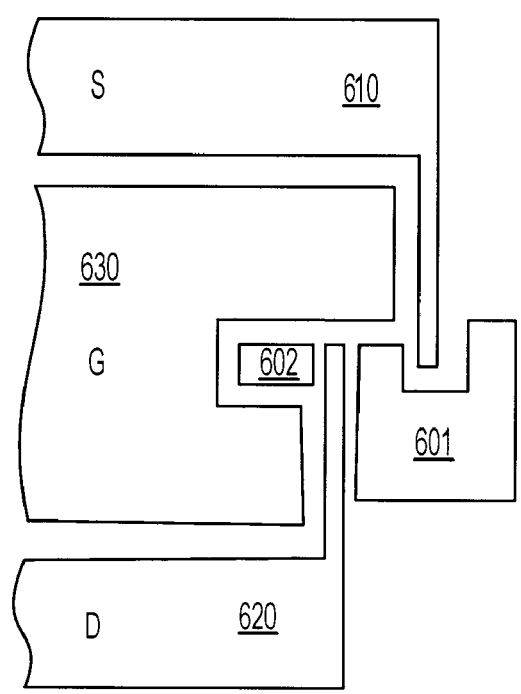
FIG. 10 is a diagram of a memory cell in accordance with a preferred embodiment of the present invention.
Figure 11:
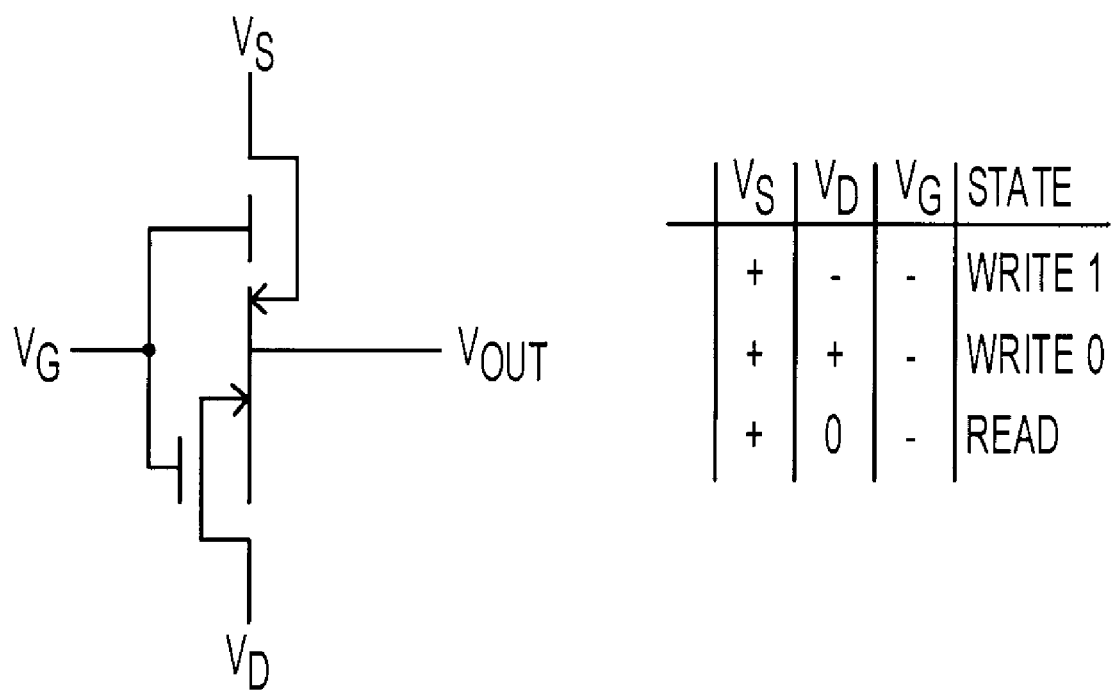
FIG. 11 is a schematic diagram of a memory cell of FIG. 10 in accordance with a preferred embodiment of the invention.

In another embodiment, switches in accordance with the present invention are incorporated in a memory cell comprising a metal electrostatic select switch (610) and non-volatile switch (620) with reset gate (630) as shown in FIG. 10. When a voltage is applied between the source 610 (say at +V) and the gate 630 (say at −V) the select switch deflects and makes contact to 601, which acts as a gate (+V) for the drain non-volatile switch 620. If the nonvolatile switch 620 floats at a voltage equal to −V it will be deflected by 601 and will make contact to it, writing a "1". Nonvolatility is provided by van der Waals force. If the nonvolatile switch 620 floats at a voltage equal to +V it will be deflected by the gate 630 (−V) and will make contact 602, which purpose is to avoid a short between the nonvolatile switch 620 and the gate 630. This process writes a "0". Reading is performed by grounding 620 and measuring continuity between 610 and 620. A "pull-up" resistor at the drain or a resistive drain as in conventional CMOS memory devices might be necessary. FIG. 11 is a schematic representation of the memory cell of FIG. 10. The memory cells may be implemented in an array such as is shown in the schematic in FIG. 12.

Figure 13:
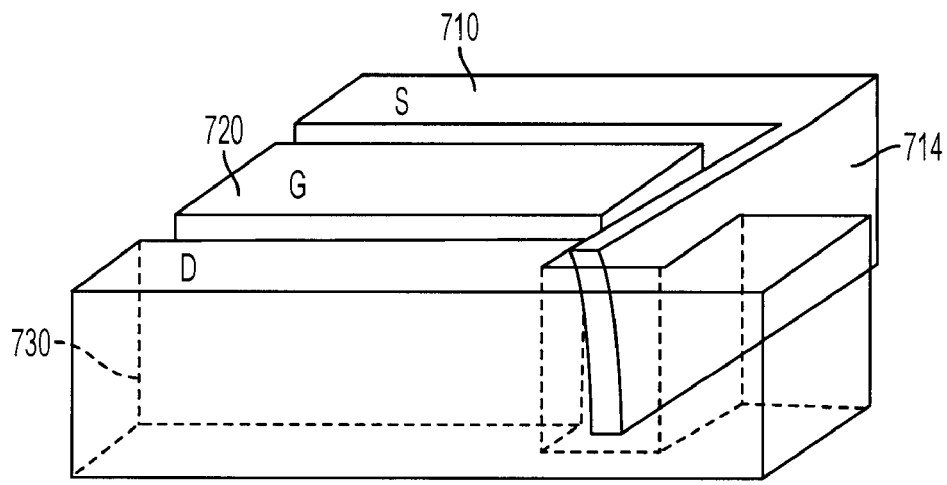
FIG. 13 is a diagram of an alternative embodiment of an electrostatic switch according to the invention.
Figure 14A:
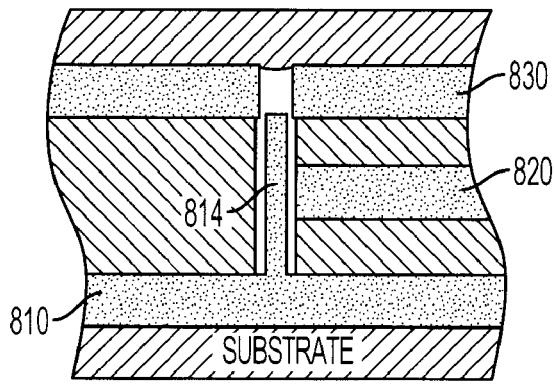
FIGS. 14A and 14B are diagrams of side views of vertically extending laterally moving nanoelectromechanical switches as part of a multilayered interconnect scheme in accordance with an embodiment of the present invention.
Figure 14C:
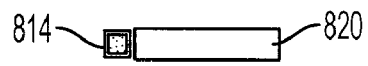
FIG. 14C is a top view of a vertically extending laterally moving nanoelectromechanical switch as part of a multilayered interconnect scheme in accordance with an embodiment of the present invention.
Figure 14B:
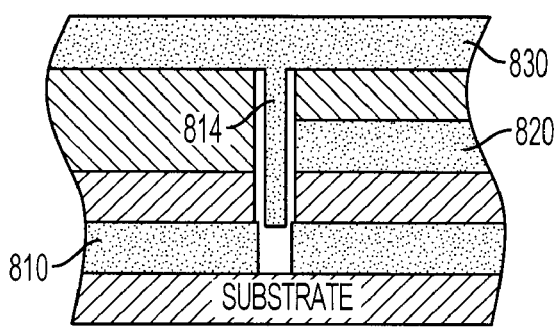

In another embodiment shown in FIG. 13, an electrostatic switch according to the invention is formed from patterned interconnect metal. The source interconnect 710 has a thin portion 714 that can flex towards the drain 730, upon application of a source (710)-gate (720) voltage. The drain interconnect 730 partially surrounds the source beam 714 to null attraction of the source by the drain voltage. The source cantilever portion 714 extends vertically and flexes laterally. The source cantilever portion 714 is not underetched in this embodiment. Van der Waals attraction between contacting source and drain can be used to provide volatile switching (springy thicker source portion, or smaller contact area) and non-volatile switching (limp thinner source portion or larger contact area).

Another embodiment is shown in FIGS. 14-18. In this embodiment, a vertically extending laterally moving nanoelectromechanical switch in accordance with the present invention is shown as part of a multilayered interconnect scheme. The functionality of the structure in FIGS. 14A-C can be understood as follows: Electrode 810 functions as source, electrode 820 functions as gate and electrode 830 is the drain. Cantilever 814 moves laterally under a source-gate voltage, until the top of cantilever 814 contacts electrode 830. Because the cross-sectional area of gate 820 and electrode is much larger than the small cross-sectional area of cantilever 814 and top electrode 830, there is only little influence of the drain voltage on the switching of the cantilever, a requirement for amplification of such elements. Surrounding the cantilever laterally with the electrode, as shown, further reduces the influence of drain voltage so that the attraction is cancelled out.

Application of +V to the source 810 and 0V to the gate 820 causes the flexible cantilever portion 814 of the source 810 to bend toward the gate 820. However, before the cantilever portion 814 of the source 810 can contact the gate 820, it contacts the contact portion 834 of the drain 830, shorting the source 810 and the drain 830. Application of $V_D=0$ to the drain 830 causes attraction between source 810 and drain 830 but because 830 surrounds 814 (see FIG. 14C) the net mechanical moment is zero. Van der Waals attraction between contacting source and drain can be used to provide volatile switching (springy thicker source portion, or smaller contact area) and non-volatile switching (limp thinner source portion or larger contact area).

Figure 15A:
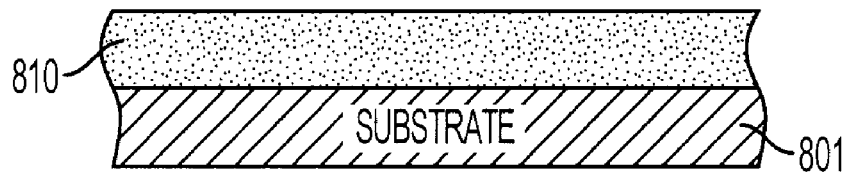
FIGS. 15A-J illustrate an exemplary method of fabricating devices according to certain embodiments of the invention.

Cross sectional FIGS. 15A-J, illustrate collectively an exemplary method of fabricating a substantially vertical nano-electromechanical switch as a part of a multilayered interconnect scheme. In FIG. 15A, a bottom conducting patterned electrode 810 is defined on a substrate 801. The substrate can be as simple as glass or plastic, and does not require semiconducting materials, although integration of the following structure is possible with a semiconductor circuit within the substrate. If conducting, the substrate could be coated with an insulating layer such us silicon oxide or silicon nitride. This bottom electrode 810 can be a laterally extending line connected to a plurality of lines, forming a two-dimensional conducting circuit. The material of this patterned electrode can consist of Aluminum, Copper or other metals, or other conducting materials.

Figure 15B:
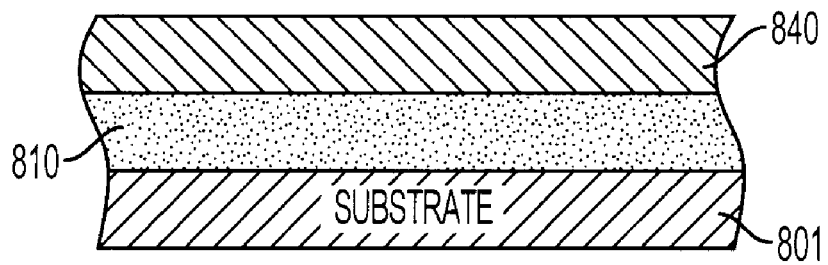

FIG. 15B Following patterning of layer 810, an insulator 840 is grown, and planarized.

Figure 15C:
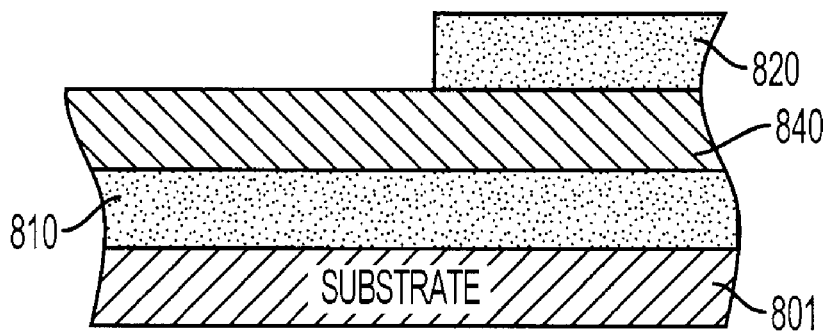

FIG. 15C Following this step, conducting patterned electrode circuit 820 is defined on top of insulator 840. The circuit 820 can be a laterally extending line connected to a plurality of lines, forming a two-dimensional conducting circuit. The material of this patterned electrode can consist of Aluminum, Copper or other metals, or other conducting materials.

Figure 15D:
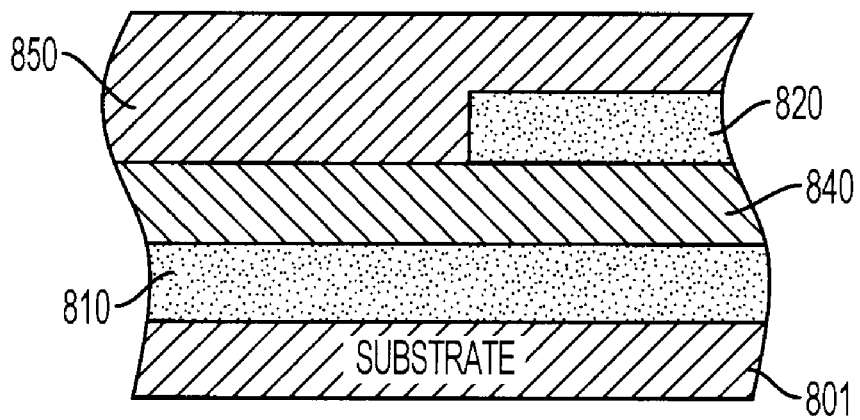
Figure 15E:
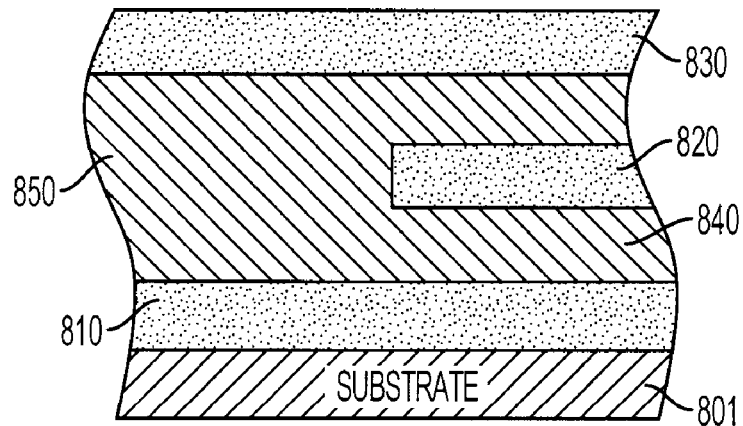

FIG. 15D Insulator 850 is deposited and subsequently planarized followed by patterned conducting electrode circuit 830 (FIG. 15E). The circuit 830 can be a laterally extending line connected to a plurality of lines, forming a two-dimensional conducting circuit. The material of this patterned electrode can consist of Aluminum, Copper or other metals, or other conducting materials.

Figure 15F:
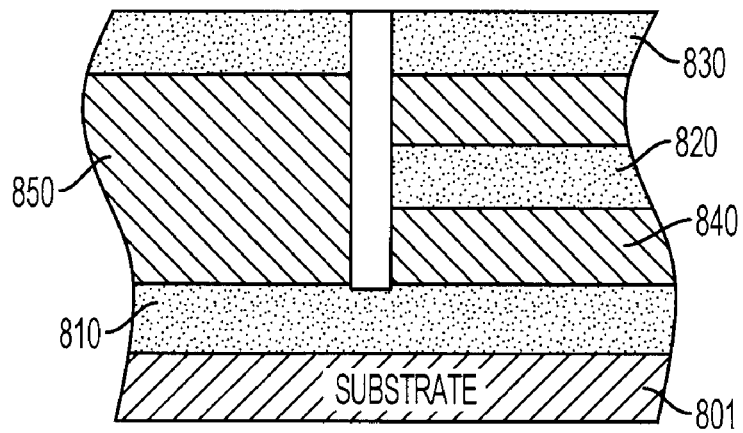

FIG. 15F Following planarization and patterning of conducting layer 830, a hole is etched in metallic layer 830 and insulating layers 840 and 850.

Figure 15G:
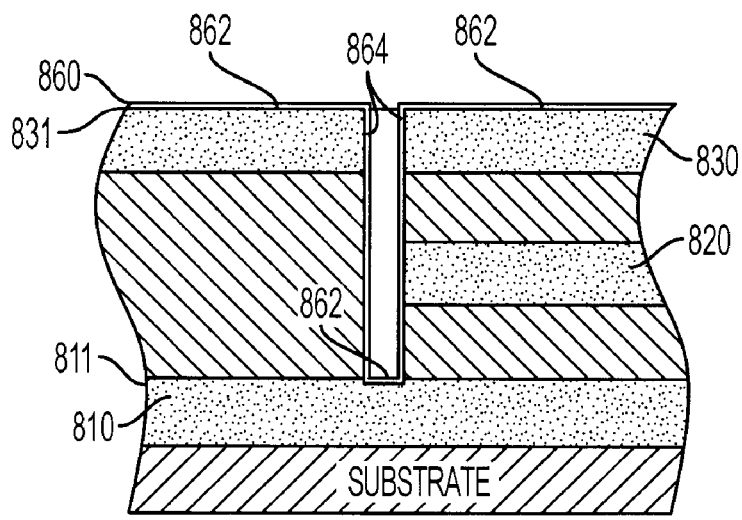

FIG. 15G A thin sacrificial layer (e.g. some oxide, 2-20 nm thick) 860 is formed in the hole. Horizontal portions of the sacrificial layer 862 cover top parts 811 and 831 of metallic layers 810 and 830, vertical portions 864 cover insulators 840 and 820 and metallic sidewalls of layers 820 and 830. The thickness of the conformal sacrificial layer will define the distance between cantilever and gate. The smaller the distance the smaller the threshold voltage.

Figure 15H:
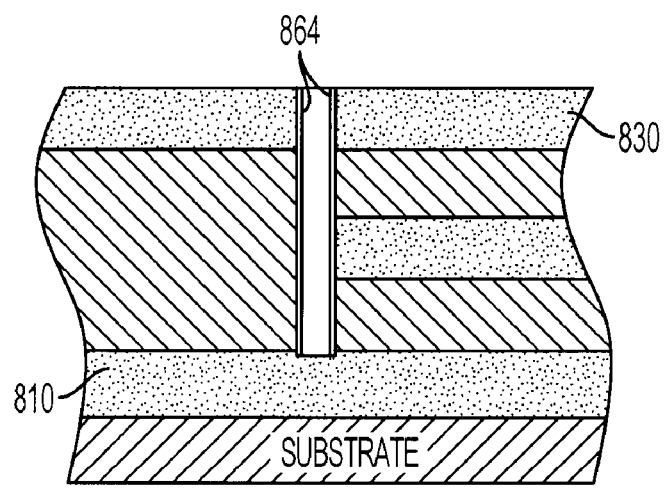

FIG. 15H Horizontal sacrificial layers 862 are removed (e.g. by oxide spacer etching) leaving sidewall structures 864.

Figure 15I:
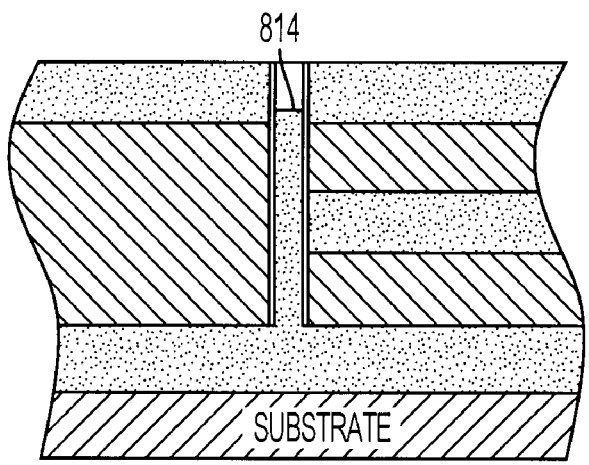

FIG. 15I Subsequently a conducting vertically extending laterally moving cantilever 814 is formed into the hole, following planarization. This cantilever can consist of a metal, a semiconductor, or nanotube materials.

Figure 15J:
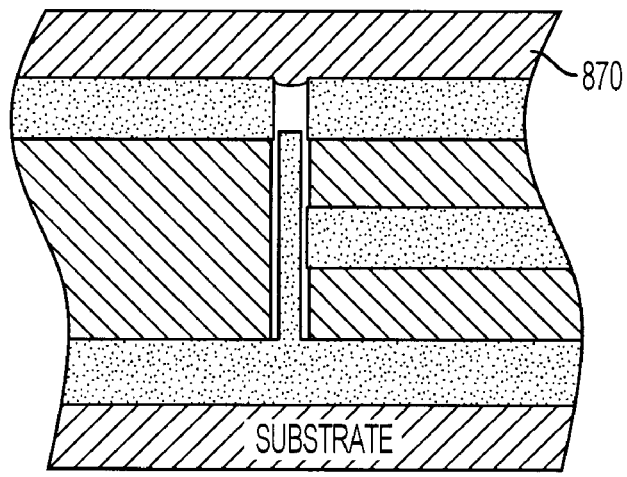

FIG. 15J Following growth of cantilever 814, the sacrificial layer 860 is removed, leaving a conducting mechanical contact between the bottom of cantilever 814 and bottom electrode 810. Following formation of this structure, it can be capped with an insulating layer 870. Because the hole diameter is very small (typically smaller than 250 nm), a spin-on dielectric with higher viscosity can be used, and will not go into the hole, but cap it conveniently. Alternatively, angled deposition schemes can be used for capping (here deposition of a capping layer is done with substrate and source at an angle, so that deposit does not grow in the hole, but quickly closes the top of the hole).

In still other embodiments, a tungsten carbide (W2C) hard conducting coating such as used for commercial conducting atomic force microscope (AFM) tips can be applied over the cantilever and drain to avoid oxidation, and fusing during contact and mechanical wear. In contrast to contact AFM, there is no lateral drag at the contact area, thus avoiding wear to a great extent. The resistivity of W2C is about 25 microohmcm, the hardness 10-20 GPa and the melting point 3028 C. Its coefficient of friction is 0.07. The high melting point also prevents electromigration. Other potential coatings include a new revolutionary "near-frictionless carbon" (NFC), with record low coefficient of friction (0.001), such as is disclosed in U.S. Pat. No. 6,548,173. It is conducting, hard and inert. A material with low coefficient of friction is important, because it will eliminate wear at the contact site.

Figure 16:
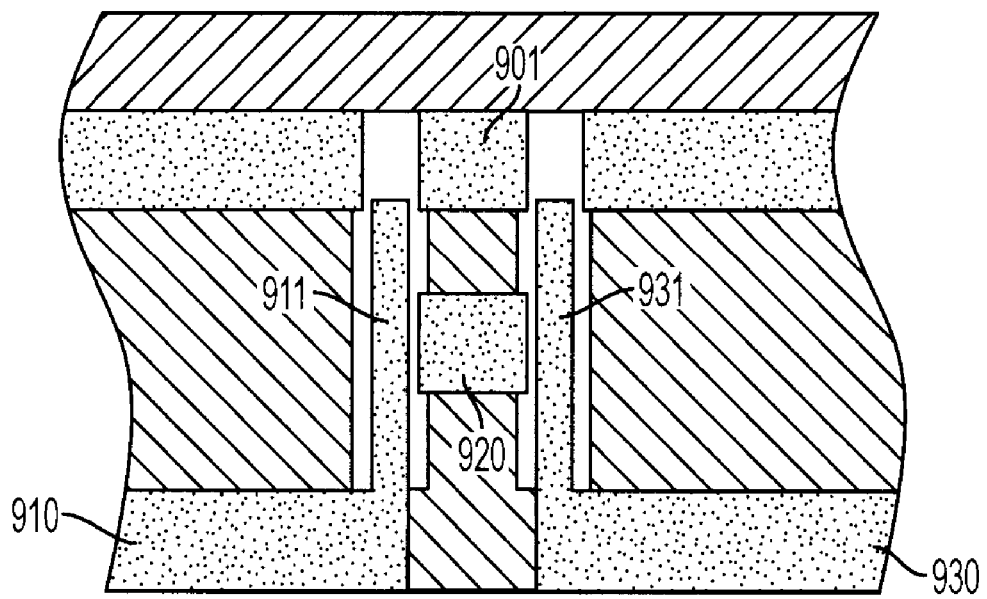
FIG. 16 is a side view of an inverter fabricated with vertically extending laterally moving nanoelectromechanical elements as part of a multilayered interconnect scheme in accordance with an embodiment of the present invention.

FIG. 16 shows an inverter circuit fabricated with vertically extending laterally moving nano-electromechanical elements analogous to the one in FIG. 9. No current is flowing from source 910 to drain 930 at any time, which reduces dissipation and power. For example, for source (910) voltage $V_S=+V$, drain (930) voltage $V_D=-V$ and gate (920) voltage $V_G=-V$. In this state, the left switch (911) is closed and the right switch (931) is open, resulting in an output (901) voltage equal to +V. When $V_G$ is changed to $V_G=+V$, the left switch opens and the right switch closes. The opening may proceed before the closing, because even a 1 nm gap results in high resistance. This means that no current can flow from 910 to 930 at any time, allowing very low power operation.

Figure 17:
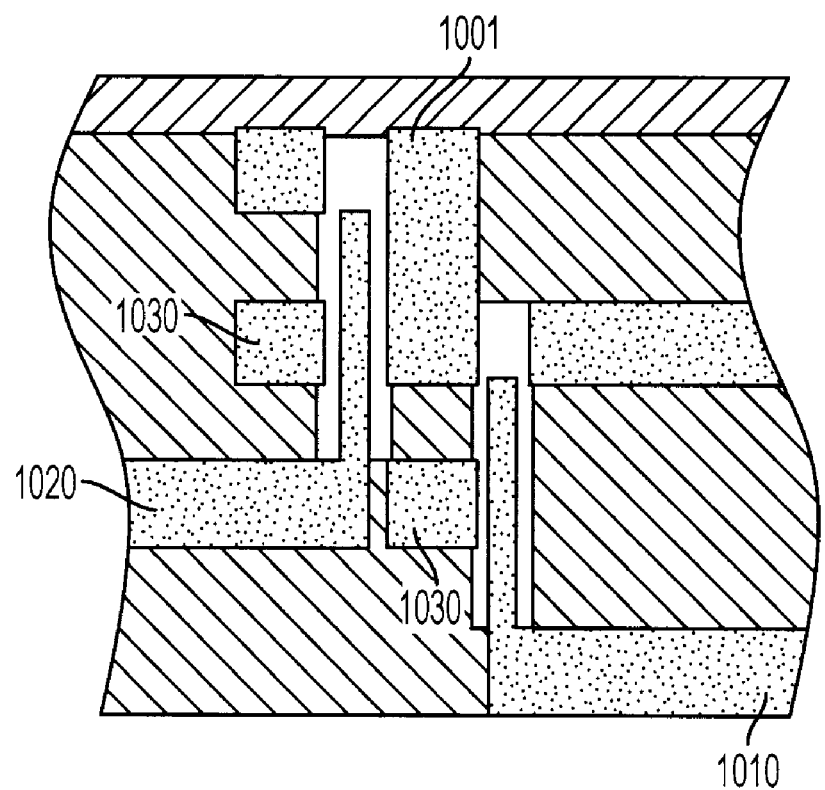
FIG. 17 is a diagram of a memory cell fabricated with vertically extending laterally moving nanoelectromechanical elements as part of a multilayered interconnect scheme in accordance with an embodiment of the present invention
Figure 18:
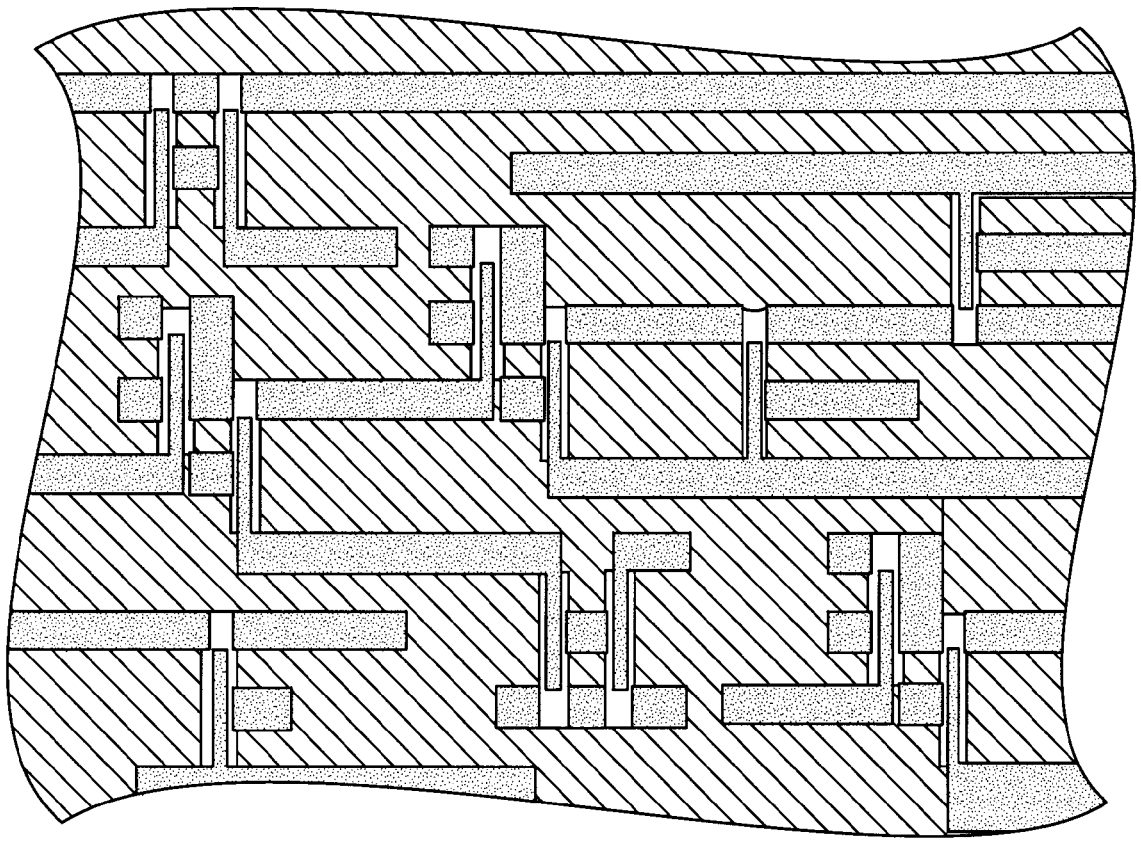
FIG. 18 is a diagram of a portion of a three-dimensional interconnect incorporating volatile and nonvolatile nanoelectromechanical elements in accordance with an embodiment of the present invention.

In another embodiment, switches in accordance with the present invention are incorporated in a memory cell comprising a metal electrostatic select switch (1010) and non-volatile switch (1020) with reset gate (1030) as shown in FIG. 17. The two portions of the gate 1030 are connected using an out-of-plane two dimensional circuit and a vertical via (not shown). When a voltage is applied between the drain 1010 (say at +V) and the gate 1030 (say at −V) the select switch 1010 deflects and makes contact to 1001, which acts as a gate (+V) for the drain non-volatile switch 1020. If the nonvolatile switch 1020 floats at a voltage equal to −V it will be deflected by 1001 and will make contact to it, writing a "1". Nonvolatility is provided by van der Waals force. If the nonvolatile switch 1020 floats at a voltage equal to +V it will be deflected by the gate 1030 (−V) and will make contact 1002, which purpose is to avoid a short between the nonvolatile switch 1020 and the gate 1030. This process writes a "0". Reading is performed by grounding 1020 and measuring continuity between 1010 and 1020. A "pull-up" resistor at the drain or a resistive drain as in conventional CMOS memory devices might be necessary.

Cross-sectional FIG. 19 schematically illustrates the incorporation of an embodiment of the present invention on an exemplary multilayered interconnect structure which can be used to realize complex memory and logic operations.

The foregoing description of the preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments as are suited to the particular use contemplated. It is intended that the scope of the invention be defined by the claims appended hereto, and their equivalents. The entirety of each of the aforementioned documents is incorporated by reference herein.

What is claimed is:

1. A three dimensional layered interconnect comprising:
   a first layer having a width and a length wherein said length of said first layer is greater than said width of said first layer;
   a second layer; and
   a switch linking said first and second layer;
   wherein said first layer and said second layer comprise patterned conducting interconnect layers separated by insulating layers and wherein said switch comprises a flexible cantilever plug positioned between said conducting interconnect layers wherein said plug is substantially perpendicular to said length of said first layer, an axis of motion of said plug is substantially parallel to said first layer and said perpendicular cantilever is actuated by electrostatic means.

2. A three dimensional layered interconnect according to claim 1 wherein said switch comprises a volatile switch.

3. A three dimensional layered interconnect according to claim 1 wherein said switch comprises a non-volatile switch.

4. A three dimensional layered interconnect according to claim 1 wherein said switch is part of an integrated logic circuit.

5. A three dimensional layered interconnect according to claim 1 wherein said flexible plug forms an open electrical circuit between two conducting layers in an undeflected state, and a short in a deflected state.

6. A three dimensional layered interconnect according to claim 5 wherein said deflected state results from a voltage between a portion of a third interconnect layer and a portion of one of said first and second layers.

7. A three dimensional layered interconnect according to claim 1 further comprising a plurality of fixed conducting plugs substantially perpendicular to said first layer, connecting at least two of said patterned conducting layers.

8. A three dimensional layered interconnect according to claim 1 further including a second circuit electrically connected to it and comprising semiconductor transistors.

9. A three dimensional layered interconnect according to claim 1 wherein said switch contains an elastically deformable material.

10. A three dimensional layered interconnect according to claim 1 wherein said switch contains carbon, tungsten, conductive metal, insulator coated with conductive metal or silicon.

11. A three dimensional layered interconnect according to claim 1 wherein said switch is part of an integrated memory element.

12. A three dimensional layered interconnect according to claim 1 further comprising a plurality of switches substantially perpendicular to a plurality of patterned conducting layers, linking at least two of said patterned conducting layers.

13. A three dimensional layered interconnect according to claim 12 wherein at least one of said switches is part of an integrated memory element.

14. A three dimensional layered interconnect according to claim 12 wherein at least one of said switches is part of an integrated logic circuit.

15. A three dimensional layered interconnect according to claim 12 further including a second circuit electrically connected to it and comprising semiconductor transistors.

16. A three dimensional layered interconnect comprising:
   a first layer having a width and a length wherein said length of said first layer is greater than said width of said first layer;
   a second layer; and
   a switch linking said first and second layer;
   wherein said first layer and said second layer comprise patterned conducting interconnect layers separated by insulating layers and wherein said switch comprises a flexible cantilever plug positioned between said conducting interconnect layers wherein said plug is substantially perpendicular to said length of said first layer, an axis of motion of said plug is substantially parallel to said first layer and said perpendicular cantilever is actuated by electrostatic means and wherein said flexible plug acts as a source and is partially surrounded by a portion of a first patterned conducting layer acting as a gate and partially or fully surrounded by a portion of a second patterned conducting layer acting as a drain wherein there are vertical gaps separating the plug from the gate and drain.

17. A three dimensional layered interconnect according to claim 16 wherein said flexible plug has an undeflected state when no source-gate bias is applied, and a deflected state when a finite source-gate bias is applied wherein said flexible plug contacts said drain.

* * * * *